May 2, 1961 W. SHOCKLEY 2,982,002

FABRICATION OF SEMICONDUCTOR ELEMENTS

Filed March 6, 1959

WILLIAM SHOCKLEY
INVENTOR

BY Flehr and Swain
ATTORNEY

United States Patent Office 2,982,002

Patented May 2, 1961

2,982,002

FABRICATION OF SEMICONDUCTOR ELEMENTS

William Shockley, 23466 Corta Via, Los Altos, Calif.

Filed Mar. 6, 1959, Ser. No. 797,788

2 Claims. (Cl. 29—25.3)

This invention relates to methods for forming two-terminal semiconductor elements, and to methods for assembling such elements in matrices.

In telephone switching systems, and in quick access matrix memory circuits, it is desirable to form arrays of semiconductor elements in rows and columns, with the elements making connections between a first set of conductors traversed by a second set of conductors. The conductors in the first set are insulated from those in the second set, except where they are connected together by a common two-terminal semiconductor element.

My co-pending application, Serial No. 775,504, filed November 21, 1958, discloses a means for forming a switching matrix of four-layer semiconductor diode elements. In that application, the array of elements is held within a slice of semiconductor material, and the electrode system is applied. The remaining unwanted semiconductor material is then removed, leaving an array or matrix of cross-connected semiconductive elements. This method, although extremely economical if reliable material is available, is progressively less advantageous as the yield of satisfactory elements decreases. The invention of my co-pending application allows for the presence of a certain number of poor elements from the matrix, but the consequence of this procedure is that the presence of one bad element in a row of column often leads to the rejection of a large number of good elements which happen to lie in the same row or column.

This invention provides simplified means for economically processing a large number of elements without having to reject good elements as a consequence with their being in line with a bad element in a matrix array. The preferred method of the invention avoids individual handling of the elements, and also provides for the fabrication of compact matrix arrays by relatively simple procedure.

Briefly, this invention contemplates the method of producing a cross-connected array of semiconductor elements having first and second terminals from a group of such elements, which may include some defective or unsuitable elements. A first series of the elements is mounted on a first metallic conductor so the conductor is connected to the first terminals of elements in the series. A second series of the elements is mounted on a second metallic conductor so the first terminals of elements in the second series are connected to the second conductor. Suitable elements in each series are determined by conventional testing procedures, and thereafter the second terminal of a suitable element in the first series is connected to the second terminal of a suitable element in the second series.

Preferably, a series of the elements is formed by mounting a continuous strip of semiconductor material on a metallic conductor. Spaced portions of the strip of semiconductor material are removed from the conductor to leave a plurality of spaced semiconductor elements on the conductor, which serves as a first terminal for each of the spaced elements. A second terminal is applied to each of the spaced elements at a point removed from the metallic conductor to form a row of two-terminal semiconductor elements which can be assembled with similar rows to form a cross-connected matrix array. Prior to cross-connecting rows in a matrix, each individual element is tested to determine if it is satisfactory. Only satisfactory elements are cross-connected, the defective elements being left out of the matrix connections. Thus, all the bad elements are rejected without loss of entire rows of good elements.

In the preferred process, the semiconductor material is mounted on a metal which has a thermal coefficient of expansion matching that of the semiconductor material. The metal is preferably coated with gold, or another suitable inert conductor, to enhance its ability to withstand subsequent etching operations, which are preferably used to remove semiconductive material from the metal conductor to form the spaced semiconductive elements.

These and other aspects of the invention will be more fully understood from the following detailed description taken in conjunction with the accompanying drawings in which.

Figures 1, 2, 3:
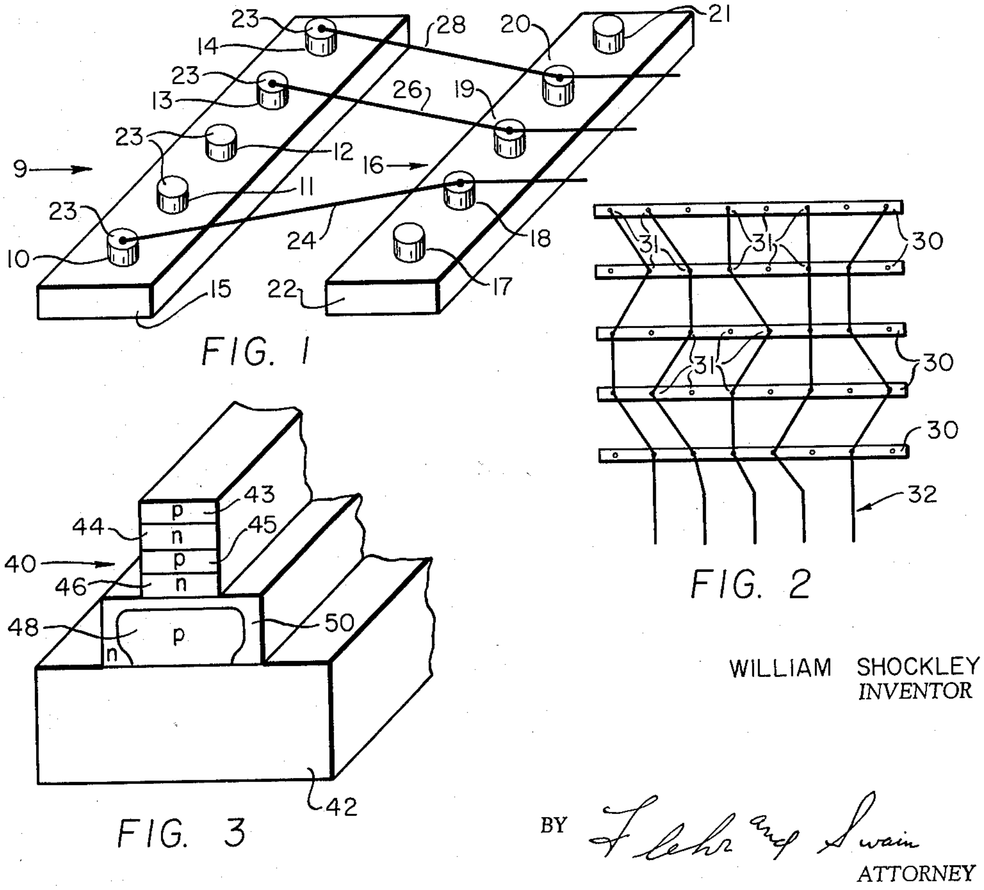
Fig. 1 is a schematic perspective of two rows of semiconductor elements, which each contain some bad or defective elements and in which the satisfactory elements are cross-connected.
Fig. 2 is a schematic sketch of a matrix array of twenty-five semiconductor elements made in accordance with this invention.
Fig. 3 is a schematic perspective view of the initial stage of forming a row of semiconductor elements such as those shown in Fig. 1.

Referring to Fig. 1, a first series or row 9 of a plurality of five spaced semiconductor elements 10, 11, 12, 13, and 14, are mounted on a first elongated metallic conductor 15. A second series or row 16 of five spaced semiconductor elements 17, 18, 19, 20, and 21, are mounted on a second elongated metallic conductor 22.

Each of the metallic conductors serves as a first terminal for the elements mounted on it, and each element includes a second terminal 23, mounted on the end remote from the respective metallic conductor. The second terminal on each of the elements can be formed by any one of several suitable well-known techniques. For example, the upper surfaces of each element can be gold plated.

The elements may be any of a variety of different types. If the matrix array is to be used in a telephone switching network, the elements may be semiconductive switches of the type described and claimed in my U.S. Patent No. 2,855,524, issued October 7, 1958. If the array is to be used in a computer memory circuit, the elements may be semiconductor memory elements such as those disclosed and claimed in my co-pending application Serial No. 798,315, filed March 2, 1959. As can often happen with semiconductor elements in the present state of the art, some of the elements in each of the rows shown in Fig. 1 may be defective. The quality or suitability of a semiconductor element can be determined in a variety of well known ways. If the element is a four-layer semiconductor switch, such as that described in my U.S. Patent No. 2,855,524, the performance characteristic of the element can be determined with the circuits outlined in the Shockley Transistor Corporation Bulletin No. 2–10H8, entitled "4-Layer Bistable Transistor Diode."

For the purposes of illustration, it is assumed that testing the elements shown in Fig. 1 disclosed the semiconductor elements 11 and 12 in the first row and elements 17 and 21 in the second row to be defective, or not satisfactory for use in the matrix array. In this case, the second terminals on the upper ends of elements 10 and 18 are cross-connected by first cross-conductor 24, to form a cross-connected pair of memory elements in the first and second rows. The second terminals of elements 13 and 19 are cross-connected by a second cross-conductor 26. The second terminals of elements 14 to 20 are cross-connected by a third cross-conductor 28. The cross-conductors are connected to the second terminal by thermal bonding techniques which do not damage the elements, and which are well known to those skilled in the art. The foregoing procedure is continued with additional rows until an array of the desired number of connected semiconductor elements is produced. The array may then be mounted in a ceramic box or otherwise sealed as discussed in my co-pending application Serial No. 775,504.

The array can be assembled by checking to find a satisfactory semiconductor element at the time each connection is made. Alternatively, all the satisfactory devices in each of the rows may be found and listed, and the wiring may then proceed in accordance with the information so obtained, rather than checking individually for a satisfactory element at each time a connection is made.

The rows of semiconductor elements may be formed by alternative procedures, such as mounting a wide layer of semiconductor material on a relatively wide metallic conductor. The semiconductor material is then etched to form a plurality of rows of spaced semiconductor elements on a single metallic conductor, which is then cut as desired to form individual rows of elements mounted on separate metallic conductors. Alternatively, the semiconductor material and metallic conductor are cut into strips prior to the etching operation.

From the preceding explanation with respect to Fig. 1, it will be apparent that the bad or defective elements are omitted from the matrix array, and only good elements are used. In this way, even though each row may contain one or more bad elements, the remaining good elements in the row can be used. With previous systems, the occurrence of a single bad element in a row could require the rejection or non-use of all the remaining good elements in that row.

Fig. 2 shows schematically five rows 30 of semiconductor elements 31, such as those described in Fig. 1, cross-connected by five cross-conductors 32 to form a matrix array of 25 cross-connected elements from a larger group of elements, some of which are defective. Of course, the number of rows and elements on each row can be expanded to build matrix arrays including hundreds and even thousands of cross-connected semiconductor elements.

It is not necessary that every good element in a row be used. It often may be desirable to leave good elements unconnected to serve as spares, which can quickly and easily be used to replace an element in the same row which may become defective after use in an array. Moreover, the elements in a row can be mounted so that the same type of terminal is not necessarily common to the metallic conductor. For example, a series of semiconductor diodes can be mounted on the conductor with some n-type terminals common and some p-type terminals common.

My co-pending application Serial No. 798,315, filed March 2, 1959 discloses semi-conductor memory elements which may be built with composite structures. Fig. 3 illustrates one such composite structure 40 mounted on a metallic rod or conductor 42. The structure is a continuous strip of semiconductor material made up of layers of alternating type semiconductor material. The top part of the structure includes four layers 43, 44, 45, 46 of alternating types of semiconductor material. The lower portion includes an interior layer 48 in contact with the rod 42 and surrounded by an exterior layer 50 which makes electrical contact with the metal conductor and the bottom layer 46 of the top part of the structure.

The strip of semiconductor material is bonded to the metallic conductor by any of several bonding techniques well known in the art. If the semiconductor material is basically silicon, a preferred metal for the metallic conductor is molybdenum, which matches the coefficient of expansion of silicon, and to which silicon can be satisfactorily bonded.

The strip of semiconductor material on the metallic conductor 42 is diced chemically into individual sections to form a linear row of spaced memory matrix elements as shown in Fig. 1. The dicing is done by chemical etching techniques, such as photo-resist masking, spraying wax, or any of several other known chemical etching techniques. In some cases, it is desirable to coat the metallic conductor with gold so that it will better withstand the chemical etching or dicing operation. The metallic conductor 42 of Fig. 3 serves as a first terminal for each of the separate elements formed after the chemical dicing operation. A second terminal (not shown) is provided on the top of each of the separate elements by gold plating, as previously discussed.

The elements formed in a series, such as shown in Fig. 1, need not necesarily be cross-connected with elements in other series as shown in Fig. 2. Instead, the second terminals of elements in one of a plurality of rows or series of elements may be connected in a circuit independently of the second terminals of elements in other rows or series. An example of this is the use of four-layer diodes in a shift register or a ring counter, where one terminal of diodes in a series is mounted on a common conductor, and the other terminals of the diodes are connected independently of terminals of elements mounted in another series on another common conductor.

This invention is not restricted to the particular means discussed above of forming a series of elements on one of the conductors. It is also applicable to situations in which the individual elements are formed separately first and are then attached to the metallic conductor by soldering, welding, pressure welding, or by other means. Such processes sometimes damage elements so that unsuitable elements are found in the series so produced. The methods of the invention are applicable to such cases.

It is also possible to form four-layer diodes and other semiconductor elements by diffusion entirely from one side and in localized areas. In such cases, a series of semiconductor elements is formed without the necessity of removing any semiconductor material to form the series.

As alternate procedures for removing semiconductor material, when desired to do so, magnetostrictive or supersonic dicing methods or other mechanical methods can also be used for forming series of the individual elements.

Matrix arrays of more complex types than that shown in Fig. 2 can be formed by having different types of elements mounted on different conductors, or even on different spaced portions of the same conductor. The transverse conductors or columns 32 in Fig. 2 need not make connections with all rows 30 of Fig. 2 in such a case.

Figure 4:
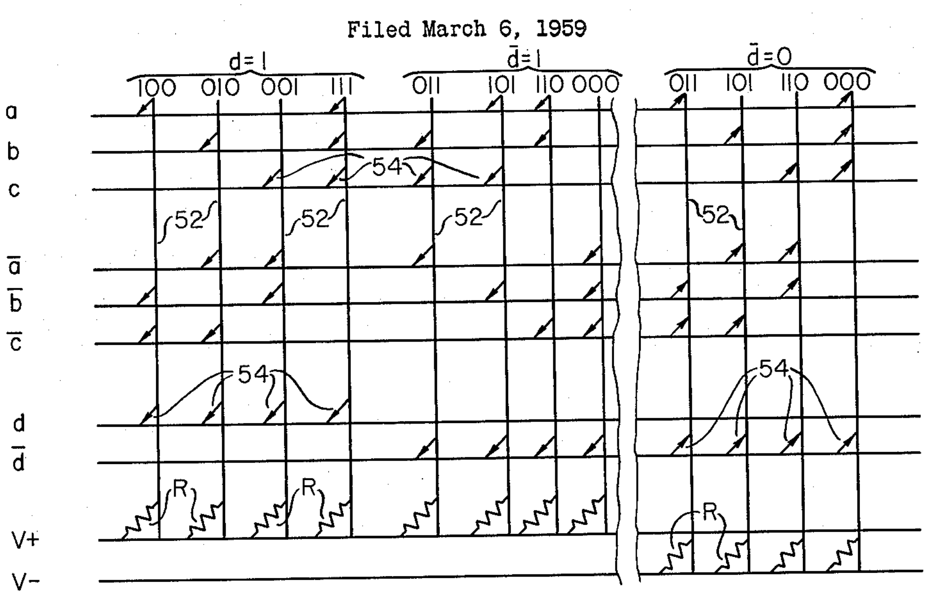
Fig. 4 is a fragmentary schematic circuit diagram of an array made in accordance with this invention in which every suitable element in one row is not necessarily connected to a suitable element in an adjacent row.

As an example of a more general matrix, consider Fig. 4, which represents a portion of a binary adding circuit. The horizontal conductors *a*, *b*, and *c* correspond to binary digits which are represented by voltages of 0 and 1 times an arbitrary scale factor. The horizontal conductors marked $\bar{a}$, $\bar{b}$, and $\bar{c}$ are complementary and correspond logically to "not *a*," etc. The horizontal output conductors *d* and $\bar{d}$ represent the unit place in the sum of $a$, $b$, and $c$ so that the following relationships hold in the binary system:

$d=0$, and $\bar{d}=1$, for $abc$=000, 011, 101, and 110

$d=1$, and $\bar{d}=0$, for $abc$=111, 100, 010, and 001

In Fig. 4, the vertical conductors 52 correspond to the vertical conductors of Fig. 2, and the arrows 54 represent diode elements of a simple rectifying or avalanche character. The lower end of each vertical conductor is connected to a horizontal supply line $V_+$ by a separate respective resistor R, which may also be a semiconductor element of high resistivity material, or consisting of thin layers like 50 in Fig. 3. The D.-C. voltage supplies $V_+$ and $V_-$ are positive and negative respectively, and larger than the unit voltages corresponding to 0 and 1.

Referring to the first column of Fig. 4, it is seen that the diodes constitute an "and" circuit for $a$, $\bar{b}$, and $\bar{c}$. Thus if the combination 100 occurs, the result $d=1$ is obtained. The diodes connected to the $d$ conductor constitutes an "or" circuit so that $d=1$ is obtained for any of the situations covered by the four columns labeled $d=1$. Similarly, $\bar{d}=1$ is obtained for the situations corresponding to its bracket.

The columns in Fig. 4 to the right of the break illustrate an alternative way of obtaining $\bar{d}=0$, using diodes of opposite polarity.

It is evident that diode logic circuits of great complexity and diversity can be produced economically by the method of this invention.

This invention is also useful in connection with more complex circuit elements. For example, diffused base transistors or multiple gate field effect transistors may be made in large numbers in a single semiconductor crystal and produced as regularly spaced elements on the conductors of Fig. 1. The conductors may then be registered on a standard base so that the terminals of the transistors occur in a standard pattern. Such an arrangement lends itself to mechanized testing and wiring. In particular, a set of standardized masks can be used in connection with photoresist techniques and metal evaporation to make connecting segments like the connecting conductors of Fig. 2.

The various techniques referred to above for bonding semiconductor materials to metals, preferential etching of semiconductor materials, magnetostrictive cutting, attaching leads to semiconductor materials without damaging the materials, and diffusion to form various p-n junctions, are well known in the transistor art, and are described in literature such as Bell Laboratories Transistor Technology Series published by D. Van Nostrand Company of Princeton, N.J. Techniques using photoresist and metal evaporation are described in the February 18, 1959 issue of Electronic Design, which also gives references to prior publications.

I claim:

1. The method of producing a cross-connected array of semiconductor elements having first and second terminals from a group of such elements, some of which may may be unsuitable, the method comprising forming a first series of the elements on a first metallic conductor so the first terminal of each of the first series elements is connected to the first conductor, forming a second series of the elements on a second metallic conductor so the first terminal of each of the second series elements is connected to the second conductor, connecting the elements in each series in a testing circuit, passing current through the elements in each series, and thereafter connecting the second terminals of elements in the first series to the second terminals of separate elements in the second series.

2. The method of producing a matrix array of cross-connected semiconductor elements, the method comprising mounting a first continuous strip of semiconductor material on a first metallic conductor, removing spaced portions of the first strip of semiconductor material from the first conductor to leave a first series of spaced semiconductor elements on the first conductor, which serves as a first terminal for the said spaced elements in the first series, mounting a second continuous strip of semiconductor material on a second metallic conductor, removing spaced portions of the second strip of semiconductor material from the second conductor to leave a second series of spaced semiconductor elements on the second conductor, which serves as a first terminal for each of the spaced elements in the second series, connecting the elements in each series in a testing circuit, passing current through the elements in each series while the elements are mounted on their respective conductors, and thereafter connecting a separate cross-conductor to an element in the first series and to an element in the second series, the point of connection of the cross-conductor to the suitable elements being spaced from their respective first terminals.

References Cited in the file of this patent

UNITED STATES PATENTS

| | | |
|---|---|---|
| 2,784,479 | Roberts | Mar. 12, 1957 |
| 2,879,458 | Schubert | Mar. 24, 1959 |